(12) United States Patent
Jeon et al.

(10) Patent No.: US 8,421,134 B2
(45) Date of Patent: Apr. 16, 2013

(54) BACK SIDE ILLUMINATION IMAGE SENSOR REDUCED IN SIZE AND METHOD FOR MANUFACTURING THE SAME

(75) Inventors: In Gyun Jeon, Seongnam-si (KR); Se Jung Oh, Seoul (KR); Heui Gyun Ahn, Seongnam-si (KR); Jun Ho Won, Seoul (KR)

(73) Assignee: Siliconfile Technologies Inc., Seoul (KR)

( * ) Notice: Subject to any disclaimer, the term of this patent is extended or adjusted under 35 U.S.C. 154(b) by 7 days.

(21) Appl. No.: 12/976,851

(22) Filed: Dec. 22, 2010

(65) Prior Publication Data

US 2011/0156113 A1 Jun. 30, 2011

(30) Foreign Application Priority Data

Dec. 29, 2009 (KR) .................. 10-2009-0132790

(51) Int. Cl.
*H01L 31/18* (2006.01)
(52) U.S. Cl. ........ 257/291; 257/296; 257/431; 257/204; 257/228; 257/229; 257/447; 257/448; 257/E31.124

(58) Field of Classification Search .............. 257/204, 257/228–229, 291, 296, 431, 447–448, E31.124
See application file for complete search history.

(56) References Cited

U.S. PATENT DOCUMENTS

| 2009/0201400 | A1* | 8/2009 | Zhang et al. ................. 348/296 |
| 2010/0230729 | A1* | 9/2010 | Ellis-Monaghan et al. .. 257/228 |

* cited by examiner

*Primary Examiner* — Tran Tran
(74) *Attorney, Agent, or Firm* — Kile Park Goekjian Reed & McManus PLLC

(57) ABSTRACT

A back side illumination image sensor reduced in chip size has a capacitor disposed in a vertical upper portion of a pixel region in the back side illumination image sensor in which light is illuminated from a back side of a subscriber, thereby reducing a chip size, and a method for manufacturing the back side illumination image sensor. The capacitor of the back side illumination image sensor reduced in chip size is formed in the vertical upper portion of the pixel region, not in the outside of a pixel region, so that the outside area of the pixel region for forming the capacitor is not required, thereby reducing a chip size.

3 Claims, 3 Drawing Sheets

BACK SIDE ILLUMINATION IMAGE SENSOR REDUCED IN SIZE AND METHOD FOR MANUFACTURING THE SAME

BACKGROUND OF THE INVENTION

1. Field of the Invention

The present invention relates to an image sensor and a method for manufacturing the same, and more particularly to a back side illumination image sensor reduced in chip size, which has a capacitor disposed in a vertical upper portion of a pixel region in the back side illumination image sensor where light is illuminated from a back side of a subscriber, thereby reducing a chip size, and a method for manufacturing the back side illumination image sensor.

2. Description of the Related Art

In general, an image sensor is a semiconductor device which converts optical image signals into electrical signals. A CCD includes respective metal-oxide semiconductor (MOS) capacitors that are very close to each other for storing and transferring electric charge carriers. A CMOS image sensor has adapted a switching scheme of making MOS transistors as many as pixels with a CMOS technology, which uses a control circuit and a signal-processing circuit as peripheral circuits, and of detecting outputs in turn with the MOS transistors.

FIG. 1 is a view schematically illustrating the configuration of a conventional CMOS image sensor, and FIG. 2 is a cross-sectional view schematically illustrating the configuration of the conventional CMOS image sensor.

As shown in FIGS. 1 and 2, the conventional CMOS image sensor 100 includes a pixel region 120, a peripheral circuit region 130, and a capacitor region 140. The pixel region 120 contains photodiodes for receiving light and generating photocharge, and transfer transistors for transferring photocharge to sensing nodes of pixels. The peripheral circuit region 130 converts sensed light into data via electrical signals.

In the pixel region 120, pixels having photodiodes PD are formed beneath the surface of a semiconductor substrate 110; and a multi-layered insulating layer and a multi-layered metal wiring layer M1 and M2, together with transfer transistors Tx, are formed on top of the semiconductor substrate 110; and light is illuminated from the front side of the semiconductor substrate 110 (Front Side Illumination).

That is, since the conventional front side illumination image sensor collects optical signals from the front side of a substrate (i.e. from the top of photodiodes), it is impossible to form metal wiring layers, which may obstruct the incidence of light, in the vertical popper portion of the photodiodes. Therefore, except for a metal wiring layer formed within a region which does not obstructs light incident to the photodiodes, the other metal wirings and capacitors are formed in the outside of the pixel region.

As described above, the conventional CMOS image sensor requires a separate area for forming capacitors in the outside of the pixel region, thereby increasing the size of a unit pixel, so that it is difficult to reduce the chip size.

SUMMARY OF THE INVENTION

Accordingly, the present invention has been made in an effort to solve the problems occurring in the related art, and an object of the present invention is to provide a back side illumination image sensor reduced in chip size, which has a capacitor region formed in an upper portion of a pixel region, in which photodiodes are formed, in the back side illumination image sensor where light is illuminated from the back side of a substrate, and a method for manufacturing the back side illumination image sensor.

In order to achieve the above object, according to one aspect of the present invention, there is provided a back side illumination image sensor reduced in chip size, the back side illumination image sensor receiving light illuminated from a back side of a semiconductor substrate wherein a pixel region and a peripheral circuit region are formed, the pixel region comprising: a photodiode formed beneath a surface of a front side of the semiconductor substrate, and configured to receive light illuminated from the back side of the semiconductor substrate and to generate photocharge; a transfer transistor configured to transfer the photocharge generated by the photodiode; an interlayer insulating layer formed above the front side of the semiconductor substrate, in which the photodiode is formed; at least one metal wiring layer formed in the interlayer insulating layer, and configured to electrically connect the photodiode and the peripheral circuit region; and a capacitor region formed above an uppermost metal wiring layer of the at least one metal wiring layer.

According to another one aspect of the present invention, there is provided a method for manufacturing a back side illumination image sensor reduced in chip size, the method comprising: a first step of distinguishing a pixel region and a peripheral circuit region in a semiconductor substrate; a second step of forming a photodiode, which receives light illuminated from a back side of the semiconductor substrate and generates photocharge, beneath a surface of a front side of the semiconductor substrate in the pixel region, and forming a transfer transistor to transfer the photocharge generated by the photodiode; a third step of forming an interlayer insulating layer above the front side of the semiconductor substrate, in which the photodiode is formed; a fourth step of forming at least one metal wiring layer, which electrically connects the photodiode and the peripheral circuit region, in the interlayer insulating layer; and a fifth step of forming a capacitor above an uppermost metal wiring layer of the at least one metal wiring layer.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
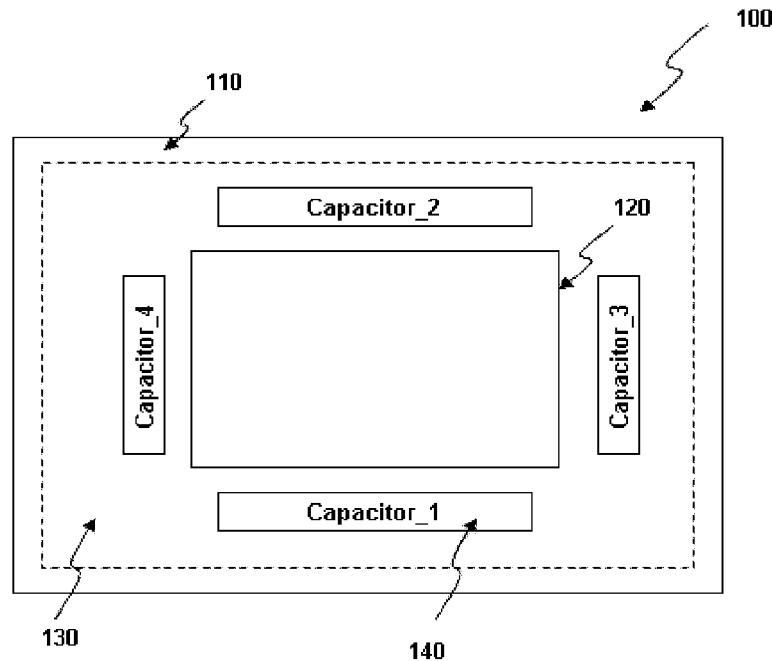
FIG. 1 is a view schematically illustrating the configuration of a conventional CMOS image sensor.
Figure 2:
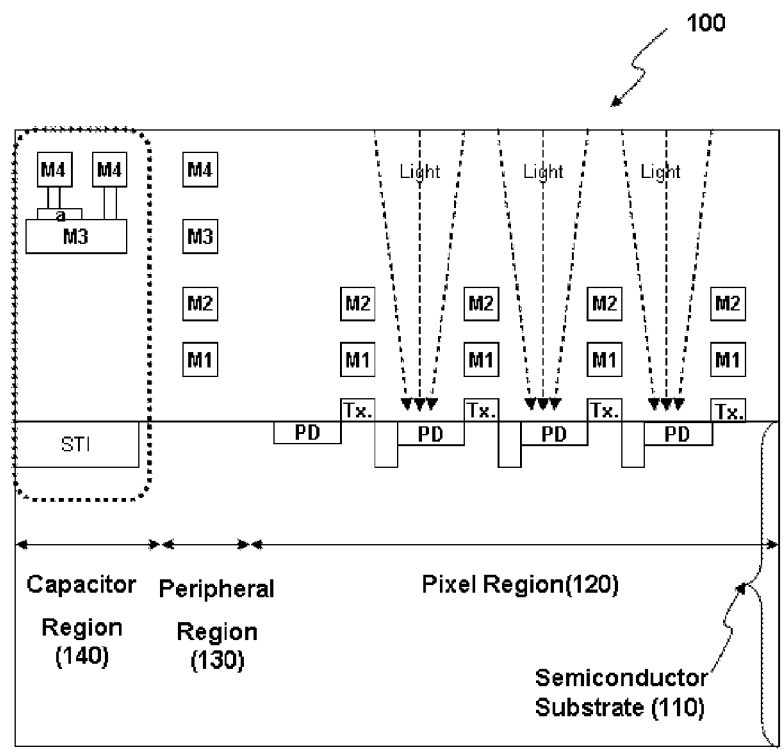
FIG. 2 is a cross-sectional view schematically illustrating the configuration of the conventional CMOS image sensor.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 3:
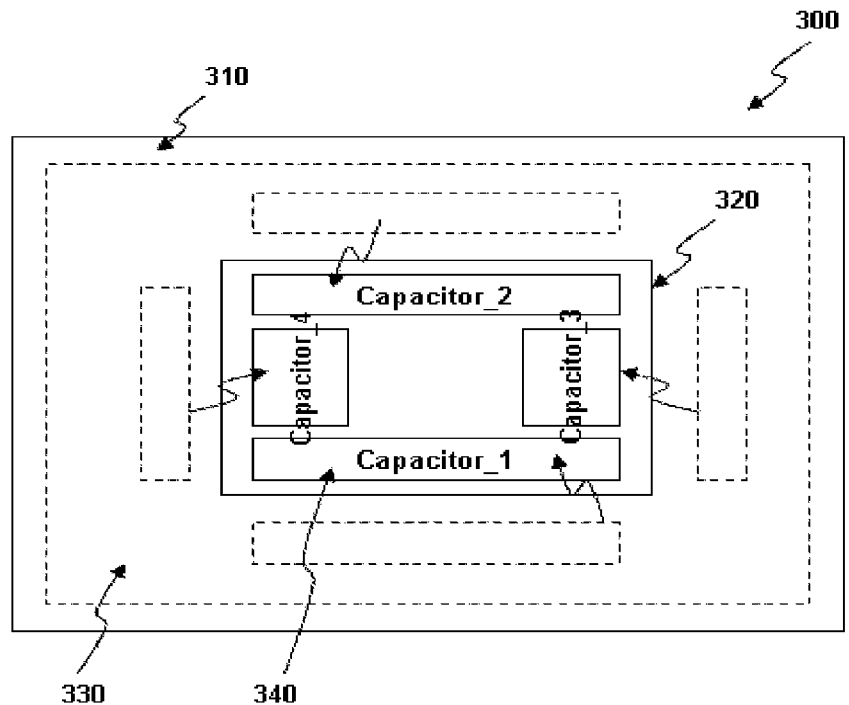
FIG. 3 is a view schematically illustrating the configuration of a back side illumination image sensor reduced in chip size according to an embodiment of the present invention.
Figure 4:
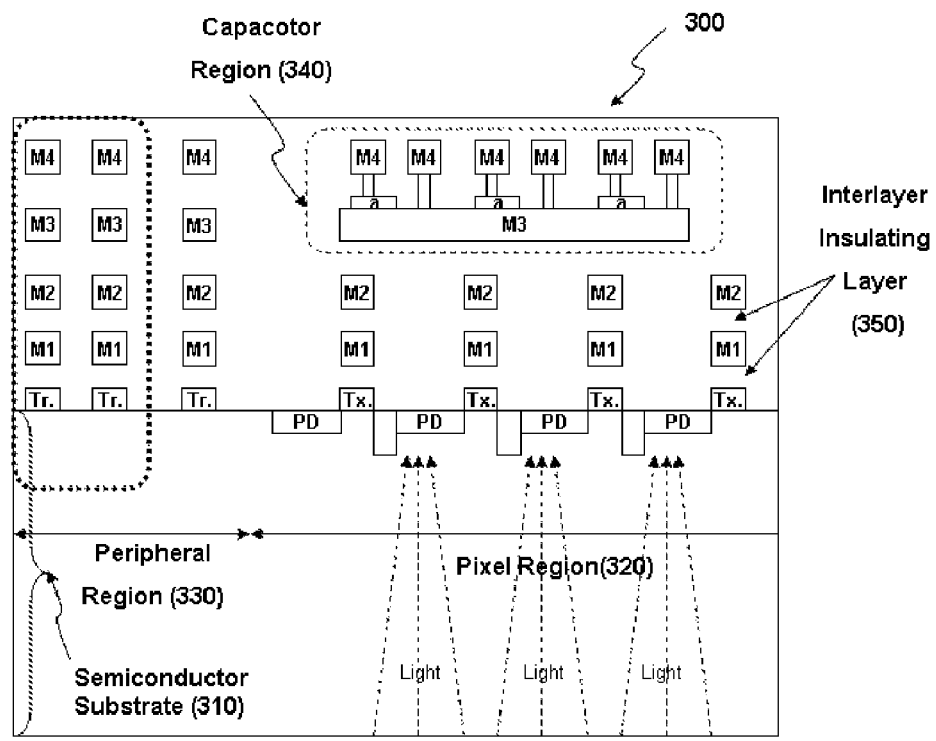
FIG. 4 is a cross-sectional view schematically illustrating the configuration of the back side illumination image sensor reduced in chip size according to an embodiment of the present invention.

FIG. 3 is a view schematically illustrating the configuration of a back side illumination image sensor reduced in chip size according to an embodiment of the present invention, and FIG. 4 is a cross-sectional view schematically illustrating the configuration of the back side illumination image sensor reduced in chip size according to an embodiment of the present invention.

As shown in FIGS. 3 and 4, the back side illumination image sensor 300 reduced in chip size according to an embodiment of the present invention includes a pixel region 320 and a peripheral circuit region 330. In addition, light is illuminated from a back side of a semiconductor substrate 310, and a capacitor region 340 is formed on top of the pixel region 320.

In this case, the pixel region 320 includes photodiodes PD, transfer transistors Tx, an interlayer insulating layer 350, a metal wiring layer M1 and M2, and the capacitor region 340.

The photodiodes PD are formed beneath the surface of the front side of the semiconductor substrate 310, and receive light from a back side of the semiconductor substrate 310 and generate photocharge. Meanwhile, the transfer transistors Tx transfer photocharge generated by the photodiodes PD.

The interlayer insulating layer 350 is formed on the front side of the semiconductor substrate 310, beneath which the photodiodes PD have been formed, and is provided therein with at least one metal wiring layer M1 and M2 which electrically connects the photodiodes and the peripheral circuit region 330.

Also, the capacitor region 340 including a plurality of capacitors, which contain capacitors M3 and M4, is formed above an uppermost metal wiring layer M2 of the metal wiring layer M1 and M2.

In this case, the capacitors may be formed in the entire or a part of a vertical upper portion of the pixel region 320.

As described above, according to the back side illumination image sensor reduced in chip size based on an embodiment of the present invention, since light is incident from the back side of a substrate, capacitors can be formed in a vertical upper portion of a pixel region, in which photodiodes are formed, so that an area required for a peripheral circuit region is reduced, thereby reducing the overall chip size.

Figure 5:
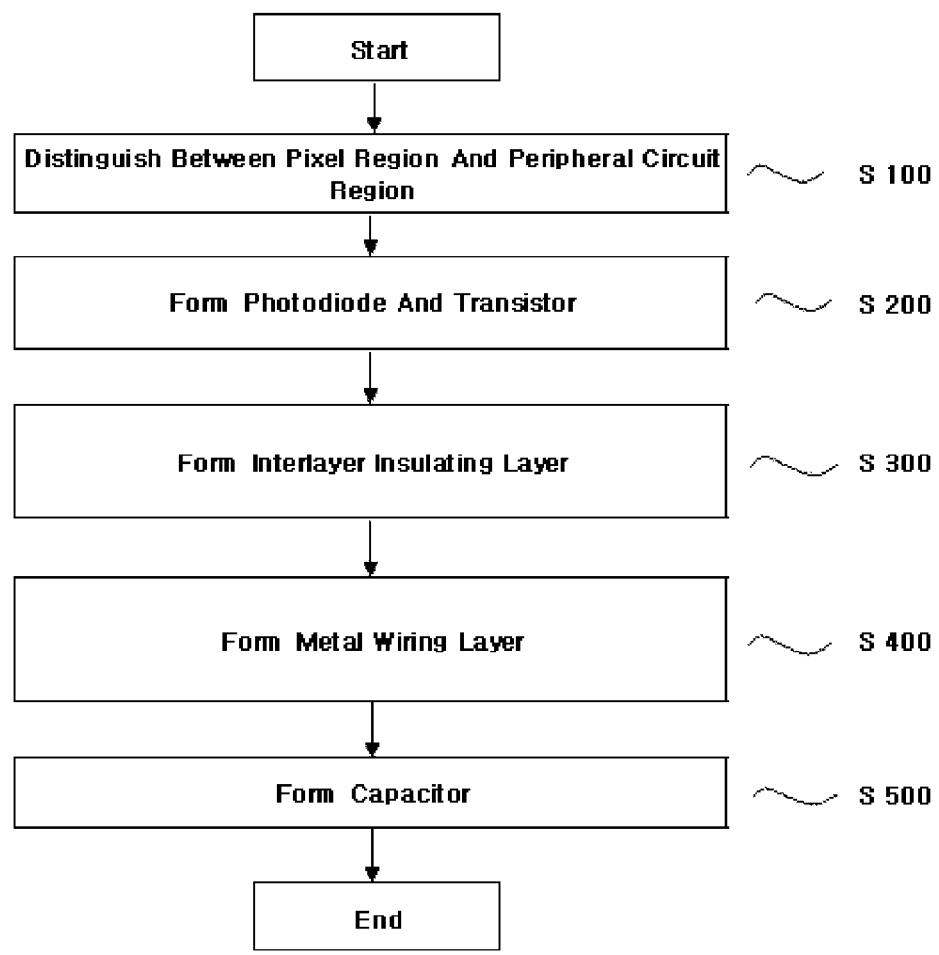
FIG. 5 is a flowchart explaining a method for manufacturing a back side illumination image sensor reduced in chip size according to an embodiment of the present invention.

FIG. 5 is a flowchart explaining a method for manufacturing a back side illumination image sensor reduced in chip size according to an embodiment of the present invention.

As shown in FIG. 5, the method for manufacturing a back side illumination image sensor reduced in chip size includes five steps from a first step S100 to a fifth step S500.

The first step S100 is a process of distinguishing between a pixel region and a peripheral circuit region in a semiconductor substrate. This step is belonging to the conventional technology, so a detailed description thereof will be omitted.

In the second step S200, photodiodes, which receive light illuminated from a back side of the semiconductor substrate and generate photocharge, are formed beneath the surface of a front side of the semiconductor substrate within the pixel region, and also transfer transistors for transferring the photocharge generated by the photodiodes are formed.

In the third step S300, an interlayer insulating layer is formed on the photodiodes and transfer transistors, which have been formed in the pixel region. In the fourth step S400, at least one metal wiring layer M1 and M2 which electrically connects the photodiodes and the peripheral circuit region is formed in the interlayer insulating layer.

In the fifth step S500, a capacitor region is formed above an uppermost metal wiring layer of the metal wiring layer. In this case, at least one capacitor is formed in the capacitor region. The capacitor may be formed the entire or a part of a vertical upper portion of the pixel region by means of a metal wiring process.

It is preferred that the capacitor is formed as a metal-insulator-metal (MIM) type capacitor by forming a third metal layer M3 and a fourth metal layer M4 through the use of a metal process, and forming an insulating layer "a" between the metal layers M3 and M4. In case of necessity, the capacitor may be formed as a poly-insulator-poly (PIP) type capacitor.

Meanwhile, it is preferred to further form a sixth step of forming a color filter on the back side of the semiconductor substrate, and a seventh step of forming a micro-lens on the color filter.

As is apparent from the above description, the present invention provides a back side illumination image sensor reduced in chip size, in which a capacitor is formed in the vertical upper portion of the pixel region, not in the outside of a pixel region, so that the outside area of the pixel region for forming the capacitor is not required, thereby reducing a chip size.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A back side illumination image sensor reduced in chip size, the back side illumination image sensor receiving light illuminated from a back side of a semiconductor substrate wherein a pixel region and a peripheral circuit region are formed, the pixel region comprising:
    a photodiode formed beneath a surface of a front side of the semiconductor substrate, and configured to receive light illuminated from the back side of the semiconductor substrate and to generate photocharge;
    a transfer transistor configured to transfer the photocharge generated by the photodiode;
    an interlayer insulating layer formed above the front side of the semiconductor substrate, in which the photodiode is formed;
    first and second metal wiring layers M1 and M2 formed in the interlayer insulating layer, and configured to electrically connect the photodiode and the peripheral circuit region, wherein the first metal wiring layer M1 is positioned between the second metal wiring layer M2 and the photodiode; and
    a capacitor region comprising a plurality of capacitors formed from a third metal wiring layer M3 and a fourth metal wiring layer M4, wherein the capacitor region is formed above the second metal wiring layer M2 such that the second metal wiring layer M2 is positioned between the capacitor region and the photodiode.

2. The back side illumination image sensor according to claim 1, wherein the capacitor region is formed in an entire or part of a vertical upper portion of the pixel region.

3. The back side illumination image sensor according to claim 2, wherein the capacitor region comprises at least one metal-insulator-metal (MIM) type capacitor.

* * * * *